(12) United States Patent
Izawa

(10) Patent No.: US 8,304,340 B2
(45) Date of Patent: Nov. 6, 2012

(54) METHOD FOR MANUFACTURING STACKED CONTACT PLUGS

(75) Inventor: Mitsutaka Izawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 195 days.

(21) Appl. No.: 12/818,570

(22) Filed: Jun. 18, 2010

(65) Prior Publication Data

US 2011/0021018 A1    Jan. 27, 2011

(30) Foreign Application Priority Data

Jul. 23, 2009  (JP) ................................. 2009-172225

(51) Int. Cl.
  *H01L 21/4763* (2006.01)
(52) U.S. Cl. ........ 438/627; 438/622; 438/624; 438/629; 438/637; 438/639; 438/652; 438/653; 257/E21.246; 257/E23.145
(58) Field of Classification Search .................. 438/622, 438/624, 627, 629, 637, 939, 652, 653; 257/E21.246, E23.145
See application file for complete search history.

(56) References Cited

U.S. PATENT DOCUMENTS

| | | | | |
|---|---|---|---|---|
| 5,035,768 A | * | 7/1991 | Mu et al. | 216/60 |
| 6,245,663 B1 | * | 6/2001 | Zhao et al. | 438/622 |
| 7,670,946 B2 | * | 3/2010 | Siew et al. | 438/637 |
| 2002/0115283 A1 | * | 8/2002 | Ho et al. | 438/633 |
| 2003/0203512 A1 | * | 10/2003 | Kweon | 438/3 |
| 2005/0191820 A1 | * | 9/2005 | Tu et al. | 438/396 |
| 2005/0202219 A1 | * | 9/2005 | Yamashita | 428/195.1 |

FOREIGN PATENT DOCUMENTS

| | | |
|---|---|---|
| JP | 10-232409 | 9/1998 |
| JP | 2005-064175 | 3/2005 |
| JP | 2006-066642 | 3/2006 |
| JP | 2008-192681 | 8/2008 |
| JP | 2008-270509 | 11/2008 |

* cited by examiner

*Primary Examiner* — Thanh V Pham
(74) *Attorney, Agent, or Firm* — Morrison & Foerster LLP

(57) ABSTRACT

A semiconductor device manufacturing method including: forming a first interlayer insulating film on a semiconductor substrate; forming a first hole in the first interlayer insulating film; forming a barrier film inside the first hole; filling a conductive material in the first hole to form a first plug; forming a second interlayer insulating film on the first interlayer insulating film; forming a second hole reaching the first plug in the second interlayer insulating film; selectively etching an upper end of the barrier film inside the second hole; and forming a second plug for connection to the first plug inside the second hole.

12 Claims, 11 Drawing Sheets

METHOD FOR MANUFACTURING STACKED CONTACT PLUGS

BACKGROUND OF THE INVENTION

1. Field of the Invention

The present invention relates to a method for manufacturing a semiconductor device.

2. Description of Related Art

Various three-dimensional structures, such as a multilayer interconnect structure and a stacked DRAM memory cell structure, have been adopted in a semiconductor device due to the miniaturization and densification thereof. In such a three-dimensional structure, there is provided a plug for connecting an upper-layer side conductive portion and a lower-layer side conductive portion through an interlayer insulating film.

For example, JP2008-192681A discloses in a stacked memory cell of a DRAM, a structure in which a cell contact plug for connection to a transistor provided on a semiconductor substrate and a capacitance contact plug for connection to an upper-layer side capacitor are connected to each other, and a structure in which a cell contact plug for connection to a transistor provided on a semiconductor substrate and a bit contact plug for connection to an upper-layer side bit line are connected to each other.

On the other hand, plugs are usually formed in the following way. First, a hole is formed in an interlayer insulating film, and a barrier film is formed inside this hole. Next, a conductive film is formed so as to fill this hole. After that, portions of the barrier film and conductive film outside the hole are removed to obtain an intended plug.

For example, JP2006-66642A discloses a plug formation method including: forming a titanium nitride layer as a barrier film inside a hole provided in an interlayer insulating film; and forming a tungsten layer so as to fill this hole. In this method, the tungsten layer is formed by a method of CVD film formation using a fluorine-containing material, and then a treatment is performed to remove fluorine from the tungsten layer.

SUMMARY OF THE INVENTION

The present inventor has revealed that a method for stacking and connecting a plurality of plugs has the following problems.

Using FIGS. 8 and 9, a description will be given of a problem involved in forming a bit contact plug on a cell contact plug in the formation of a stacked memory cell of a DRAM.

FIG. 8 is a cross-sectional view illustrating a structure in which a hole for forming a bit contact plug connected to a cell contact plug is formed in an interlayer insulating film. In the figure, reference numeral 1 denotes a silicon substrate, reference numeral 2 denotes an element isolating oxide film, reference numeral 3 denotes the lower-layer part (polycrystalline silicon) of a gate electrode, reference numeral 4 denotes the upper-layer part (tungsten) of a gate electrode, reference numeral 5 denotes a silicon nitride film, reference numeral 6 denotes a polycrystalline silicon epitaxial layer, reference numeral 7 denotes an interlayer insulating film, reference numeral 8 denotes a barrier film (titanium nitride), and reference numeral 9 denotes a plug bulk part (tungsten). Source/drain regions are omitted in the figure.

First, according to a usual method, a cell transistor is formed on the semiconductor substrate, the cell contact plug (titanium nitride barrier film 8 and tungsten bulk part 9) penetrating the interlayer insulating film is formed, and another interlayer insulating film is further formed.

Next, as illustrated in FIG. 8, a hole for forming a bit contact plug is formed in the interlayer insulating film 7 by use of lithography and dry etching techniques. At this time, the upper end of the titanium nitride barrier film 8 of the cell contact plug is transformed, thus forming an altered layer 17 containing Ti of titanium nitride and F contained in components of a dry etching gas.

Next, a titanium nitride film 10 is formed inside this hole, and then a tungsten film 11 is formed so as to fill this hole. Subsequently, as illustrated in FIG. 9, portions of the titanium nitride film and tungsten film outside the hole are removed by chemical-mechanical polishing (CMP) or the like, thereby forming a bit contact plug (titanium nitride barrier film 10 and tungsten bulk part 11). This bit contact plug is connected to a bit electrode to be formed later.

In the memory cell thus fabricated, a conduction failure or a resistance increase occurs between the cell contact plug and the bit contact plug due to the altered layer 17.

In addition, a similar problem occurs when a capacitance contact plug is formed on the cell contact plug. This problem will be described using FIGS. 10 and 11.

FIG. 10 is a cross-sectional view illustrating a structure in which a hole for forming the capacitance contact plug connected to the cell contact plug is formed in the interlayer insulating film.

After the formation of the above-described structure illustrated in FIG. 9, a bit electrode 12 for connection to a bit line is formed, a silicon nitride film 13 for covering this bit electrode 12 is formed, and an interlayer insulating film 14 is formed.

Next, as illustrated in FIG. 10, a hole for forming a capacitance contact plug is formed in the interlayer insulating film 14 by use of lithography and dry etching techniques. At this time, the upper end of the titanium nitride barrier film 8 of the cell contact plug is transformed, thus forming an altered layer 17 containing Ti of titanium nitride and F contained in components of a dry etching gas.

Next, a titanium nitride film 15 is formed inside this hole, and then a tungsten film 16 is formed so as to fill this hole. Subsequently, as illustrated in FIG. 11, portions of the titanium nitride film and tungsten film outside the hole are removed by CMP or the like, thereby forming a capacitance contact plug (titanium nitride barrier film 15 and tungsten bulk part 16). This capacitance contact plug is connected to a capacitor lower electrode to be formed later through a metal pad or the like.

In the memory cell thus fabricated, a conduction failure or a resistance increase occurs also between the cell contact plug and the capacitance contact plug due to the altered layer 17.

In one embodiment, there is provided a semiconductor device manufacturing method including:

forming a first interlayer insulating film on a semiconductor substrate;

forming a first hole in the first interlayer insulating film;

forming a barrier film inside the first hole;

filling a conductive material in the first hole to form a first plug;

forming a second interlayer insulating film on the first interlayer insulating film;

forming a second hole reaching the first plug in the second interlayer insulating film;

selectively etching an upper end of the barrier film inside the second hole; and forming a second plug for connection to the first plug inside the second hole.

In another embodiment, there is provided a semiconductor device manufacturing method including:

forming a first interlayer insulating film on a semiconductor substrate;

forming a first hole in the first interlayer insulating film;

forming a barrier film containing titanium inside the first hole;

filling a conductive material in the first hole to form a first plug;

forming a second interlayer insulating film on the first interlayer insulating film;

performing dry etching using an etching gas containing a fluorine atom-containing component to form a second hole reaching the first plug in the second interlayer insulating film;

selectively etching and removing an altered layer formed as a result of the upper end of the barrier film being transformed inside the second hole; and forming a second plug for connection to the first plug inside the second hole.

According to an embodiment, it is possible to satisfactorily interconnect plugs to be stacked.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Hereinafter, methods for manufacturing a DRAM (Dynamic Random Access Memory), including a step of connecting metal plugs to each other, will be described as exemplary embodiments. In particular, a case is described in which a titanium-containing barrier film is used in the formation of a lower-layer side plug, and a hole is formed in an interlayer insulating film by dry etching using an etching gas containing a fluorine atom-containing component in the formation of an upper-layer side plug for connection to this plug.

Figure 1:
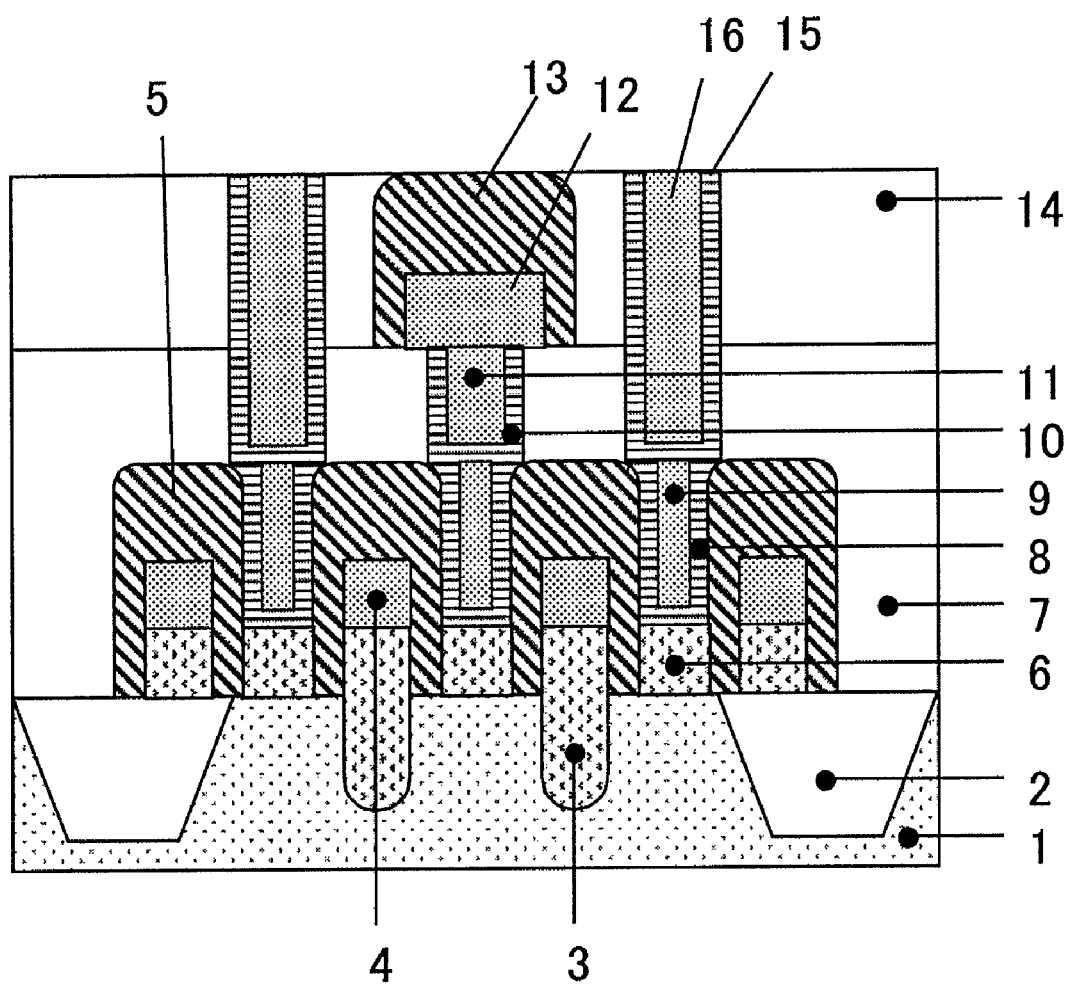
FIG. 1 is a partial cross-sectional view of a semiconductor device formed by applying one exemplary embodiment.

FIG. 1 illustrates a structural example (partial cross-sectional view) of a portion within a stacked DRAM memory cell lower than the capacitor electrode thereof.

In FIG. 1, a pair of cell transistors connected to the same bit line electrode 12 are provided in an active region partitioned by an element isolating oxide film 2 on a silicon substrate 1. The gate electrode of each cell transistor includes a polycrystalline silicon lower-layer part 3 and a tungsten upper-layer part 4. The lower portion of the polycrystalline silicon lower-layer part 3 is provided inside a trench formed in the semiconductor substrate, and a gate oxide film intervenes between the lower portion of the polycrystalline silicon lower-layer part 3 and the semiconductor substrate in the trench. An impurity-diffused layer (not illustrated) is formed on both sides of each gate electrode of the silicon substrate. An impurity-containing polycrystalline silicon epitaxial layer 6 is provided on the impurity-diffused layer. A source/drain region is formed of this impurity-diffused layer and the polycrystalline silicon epitaxial layer 6. As described above, the cell transistors of the present exemplary embodiment have a so-called trench gate structure and a raised source/drain structure.

A cell contact plug for connection to each cell transistor includes a titanium nitride barrier film 8 and a tungsten bulk part 9, and is connected to the polycrystalline silicon epitaxial layer 6. A bit contact plug (titanium nitride barrier film 10 and tungsten bulk part 11) or a capacitance contact plug (titanium nitride barrier film 15 and tungsten bulk part 16) is provided immediately above each cell contact plug. Note that in FIG. 1, reference numerals 5 and 13 denote a silicon nitride film and reference numerals 7 and 14 denote an interlayer insulating film.

A method for forming the abovementioned structure will be described using FIGS. 2 to 4.

Figure 2:
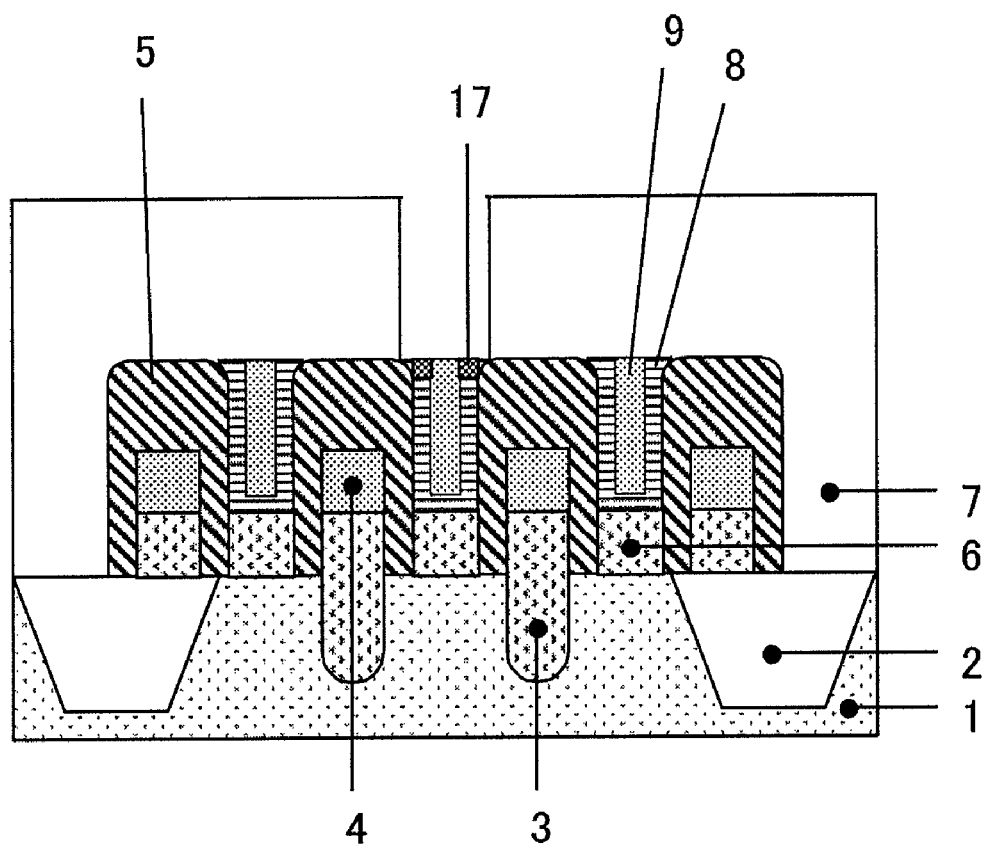
FIG. 2 is a cross-sectional view used to explain a step in the process of forming the semiconductor device illustrated in FIG. 1.

FIG. 2 is a cross-sectional view illustrating a structure in which a hole for forming a bit contact plug connected to a cell contact plug is formed in the interlayer insulating film 7.

First, the element isolating oxide film 2 is formed on the silicon substrate 1, and then the gate electrode (polycrystalline silicon lower-layer part 3 and tungsten upper-layer part 4) is formed. The polycrystalline silicon lower-layer part 3 of the gate electrode is formed on a gate oxide film (not illustrated), and fills a trench provided in the silicon substrate 1. After that, there is formed a structure in which the gate electrode is covered with a silicon nitride film 5. Such a structure can be formed in the following way, for example. First, a trench is formed in the silicon substrate 1 in which the element isolating oxide film 2 is formed. After an oxide film is formed inside the trench, a polycrystalline silicon film is formed so as to fill this trench. Then, a tungsten film is formed on the polycrystalline silicon film and a silicon nitride film is further formed. Subsequently, this laminated film is patterned into a gate shape. Then, a silicon nitride film is formed, so as to cover this gate pattern, and is then etched back. As a result, there is obtained the gate electrode covered with the silicon nitride film.

Next, selective growth is performed to form the polycrystalline silicon epitaxial layer 6 on the silicon substrate 1.

Next, an impurity is ion-implanted into each polycrystalline silicon epitaxial layer 6 and a portion of the silicon substrate 1 underneath the polycrystalline silicon epitaxial layer, thereby forming a source/drain region (not illustrated).

Next, an interlayer insulating film, such as a silicon oxide film, is formed and is CMP-processed until the upper surface of the silicon nitride film 5 becomes exposed. Then, an interlayer insulating film, such as a silicon oxide film, is formed once again.

Next, a contact hole is formed in this interlayer insulating film. At that time, the position of the hole between the gate electrodes is determined in a self-aligned manner due to a difference in etching rate between the silicon nitride film 5 and the interlayer insulating film (for example, a silicon oxide film).

Next, a titanium nitride film 8 is formed inside the contact hole, and then a tungsten film 9 is formed so as to fill the contact hole. Subsequently, CMP is performed to remove portions of the titanium nitride film and tungsten film outside the hole. As a result, there is obtained the cell contact plug (titanium nitride barrier film 8 and tungsten bulk part 9).

Next, an interlayer insulating film for covering the cell contact plug is formed. Note that in FIG. 2, this interlayer insulating film is depicted integrally with the interlayer insulating film formed before forming the cell contact plug is formed.

Next, as illustrated in FIG. 2, a hole for forming the bit contact plug is formed in the interlayer insulating film 7 by use of lithography and dry etching techniques. At this time, the upper end of the titanium nitride barrier film 8 of the cell contact plug is transformed, thus forming an altered layer 17 containing Ti of titanium nitride and F contained in components of a dry etching gas.

Figure 3:
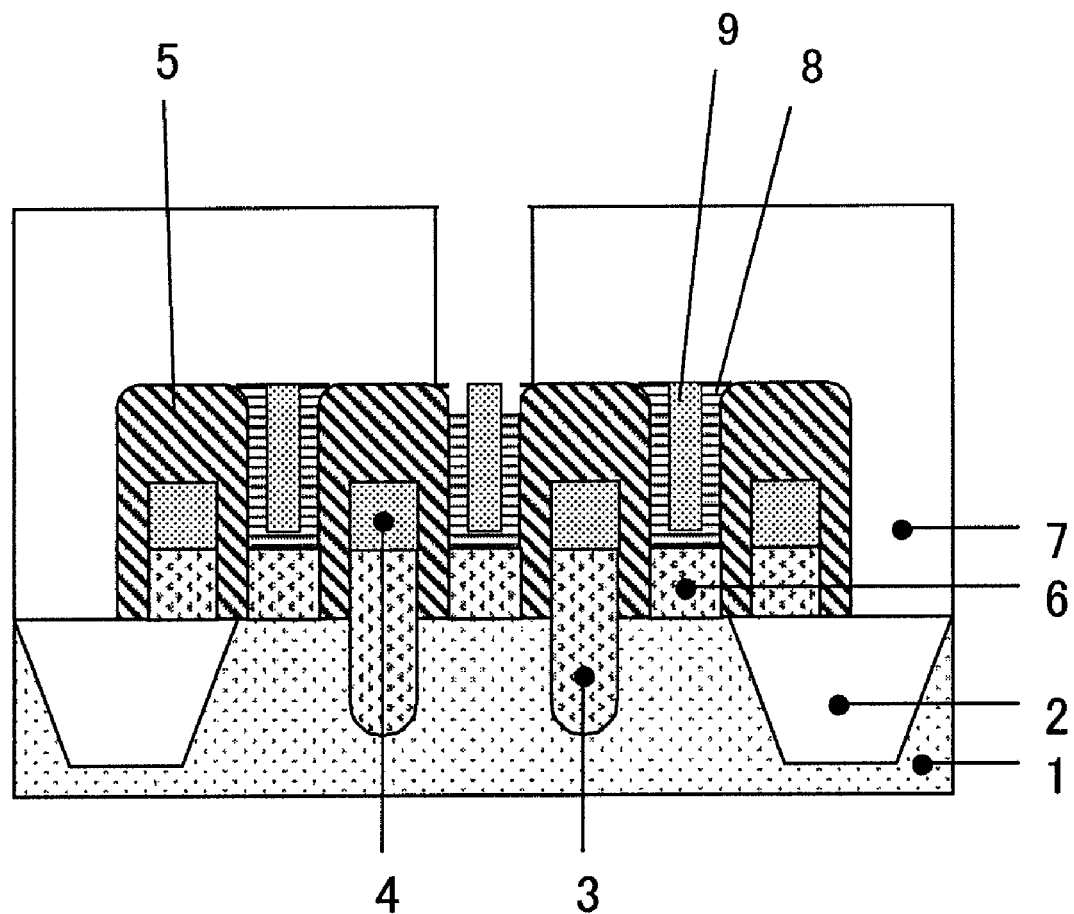
FIG. 3 is a cross-sectional view used to explain a step following the step of forming a structure illustrated in FIG. 2.
Figure 4:
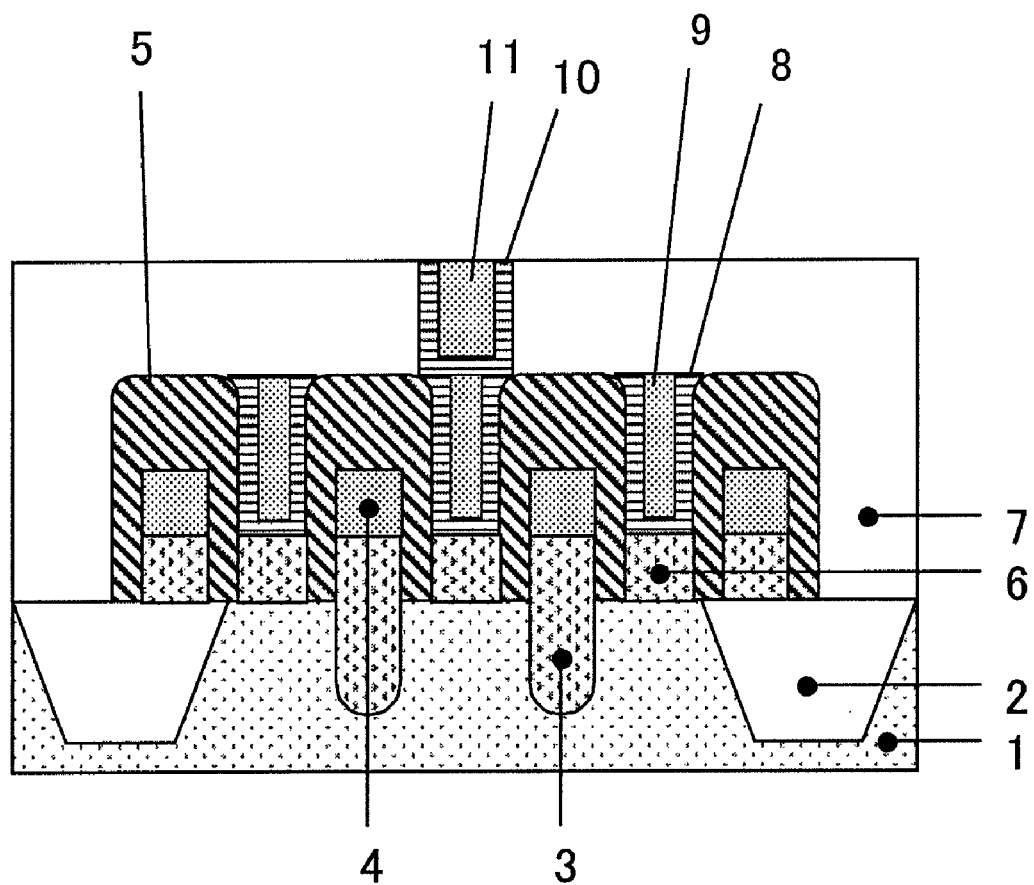
FIG. 4 is a cross-sectional view used to explain a step following the step of forming a structure illustrated in FIG. 3.

Next, as illustrated in FIG. 3, the altered layer 17 is selectively dry-etched and removed by a metal dry etcher using an etching gas containing chlorine, boron trichloride and argon. Dry etching conditions can be set to, for example, a pressure of 10 mTorr (1.33 Pa), a source power of 800 W, a bias power of 100 W, an etching gas ($Cl_2$/$BCl_3$/Ar) flow rate of 80/80/80 sccm (standard $cm^3$/min).

Next, a titanium nitride film 10 is formed inside this hole, and then a tungsten film 11 is formed so as to fill this hole. Subsequently, as illustrated in FIG. 4, CMP is performed to remove portions of the titanium nitride film and tungsten film outside the hole, thereby forming the bit contact plug (titanium nitride barrier film 10 and tungsten bulk part 11). This bit contact plug is connected to a bit electrode to be formed later.

According to the above-described method, it is possible to satisfactorily connect the cell contact plug and the bit contact plug to each other without causing any conduction failure or resistance increase.

Hereinafter, steps up to subsequently forming a capacitance contact plug will be described using FIGS. 5 to 7.

A bit electrode 12 (tungsten) is formed on the bit contact plug (titanium nitride barrier film 10 and tungsten bulk part 11), and a structure in which this bit electrode 12 is covered with a silicon nitride film 13 is formed. This structure can be formed in the following way. First, a tungsten film is formed and a silicon nitride film is formed thereon. Then, this laminated film is patterned. Next, a silicon nitride film is formed, so as to cover this pattern, and is etched back. As a result, there is obtained the bit electrode covered with the silicon nitride film.

Next, an interlayer insulating film 14 made of a silicon oxide film or the like is formed.

Figure 5:
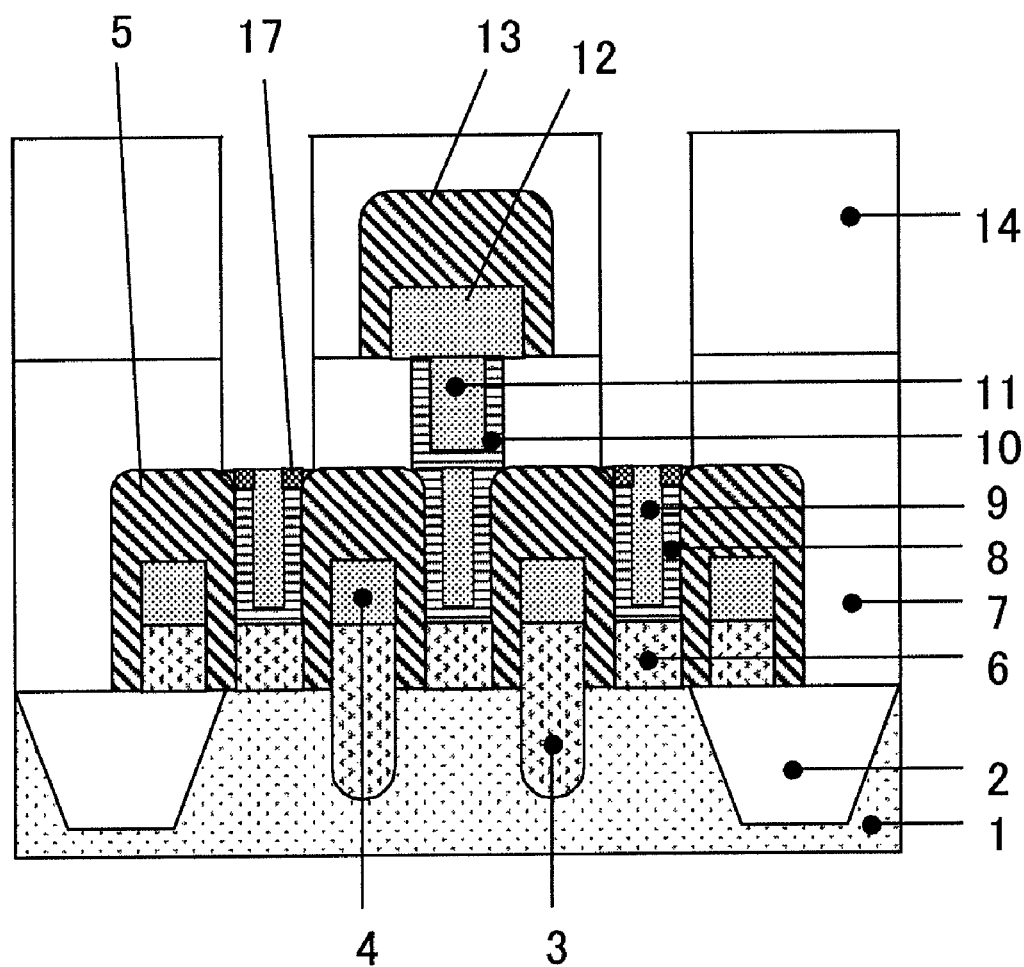
FIG. 5 is a cross-sectional view used to explain another step in the process of forming the semiconductor device illustrated in FIG. 1.

Next, as illustrated in FIG. 5, a hole used for forming the capacitance contact plug is formed in the interlayer insulating film 14 by use of lithography and dry etching techniques. At this time, the upper end of the titanium nitride barrier film 8 of the cell contact plug is transformed, thus forming an altered layer 17 containing Ti of titanium nitride and F contained in components of an dry etching gas.

Figure 6:
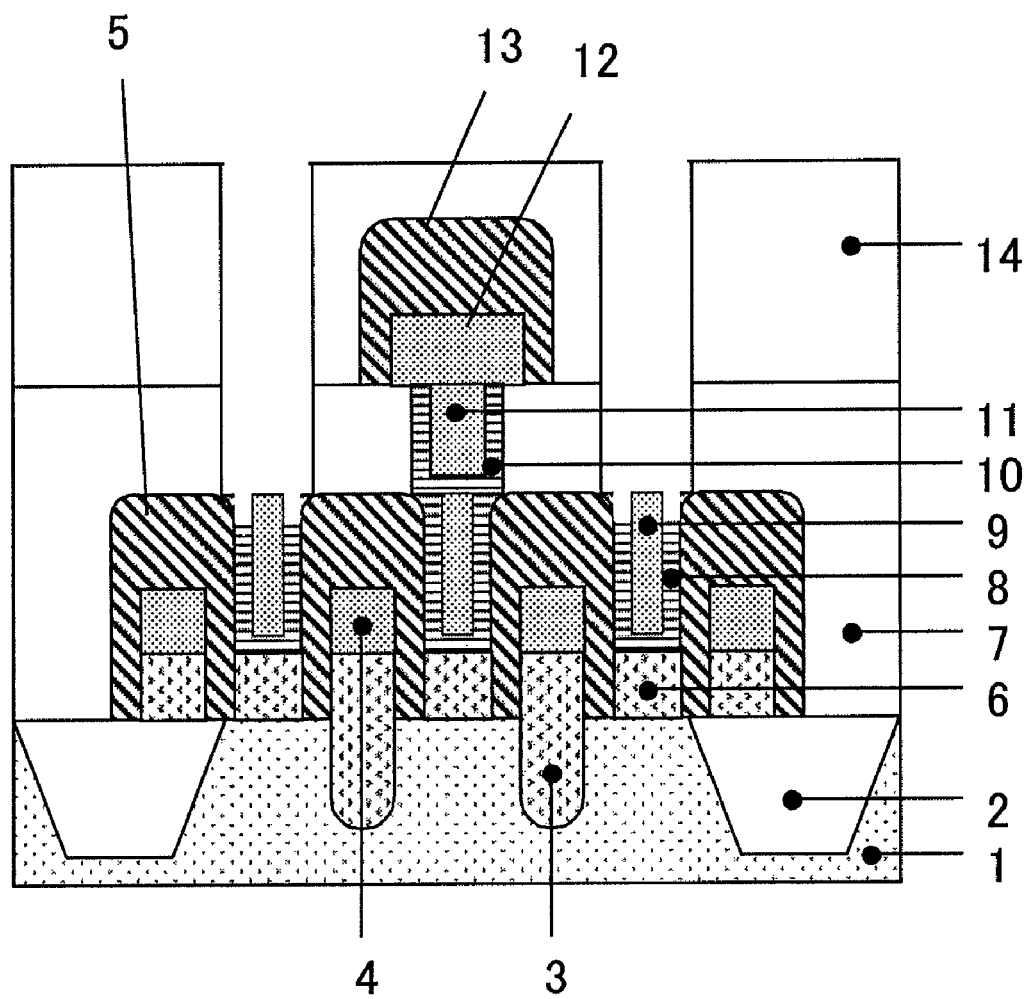
FIG. 6 is a cross-sectional view used to explain a step following the step of forming a structure illustrated in FIG. 5.
Figure 7:
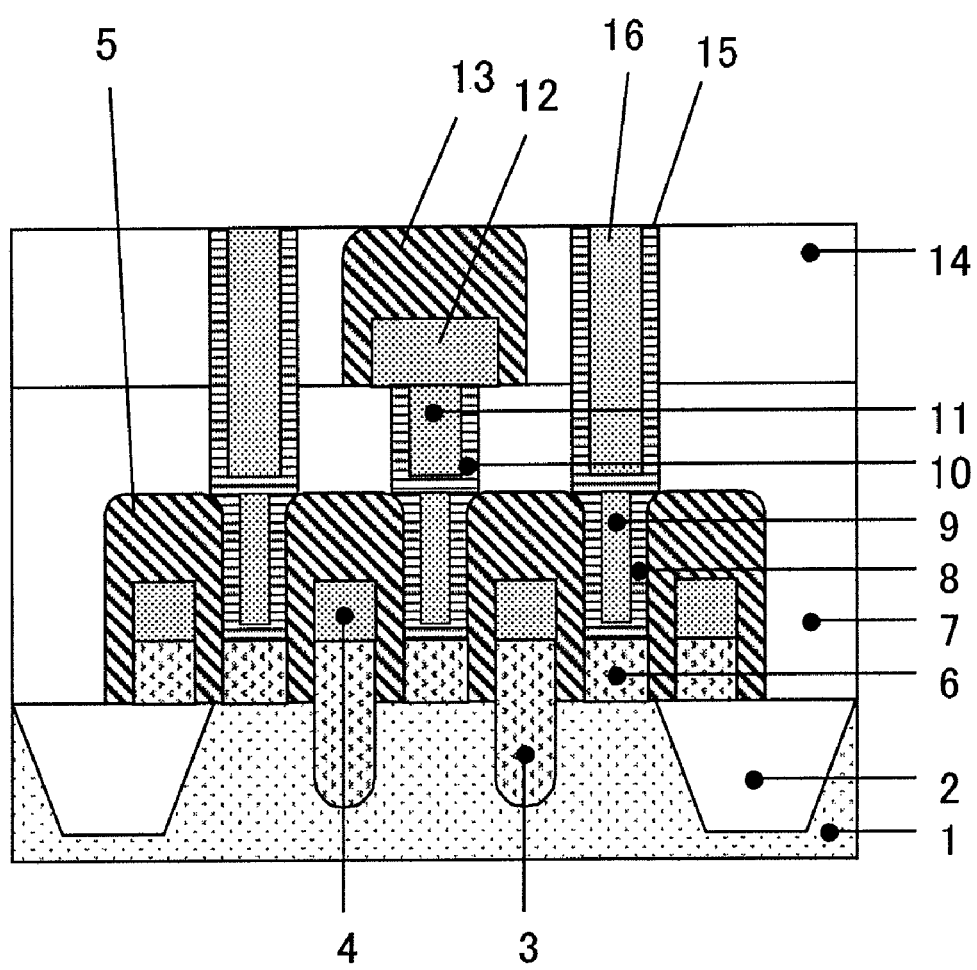
FIG. 7 is a cross-sectional view used to explain a step following the step of forming a structure illustrated in FIG. 6.
Figure 8:
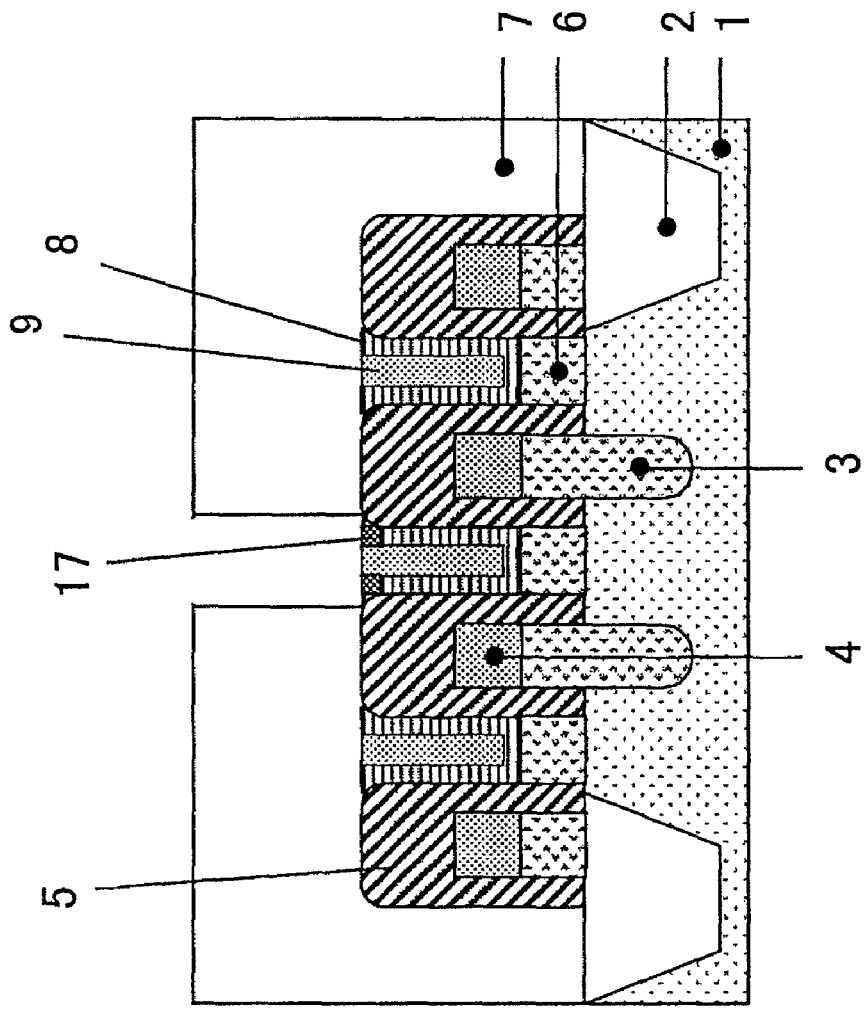
FIG. 8 is a cross-sectional view used to explain a step in the process of forming a memory cell of a DRAM in the related art.
Figure 9:
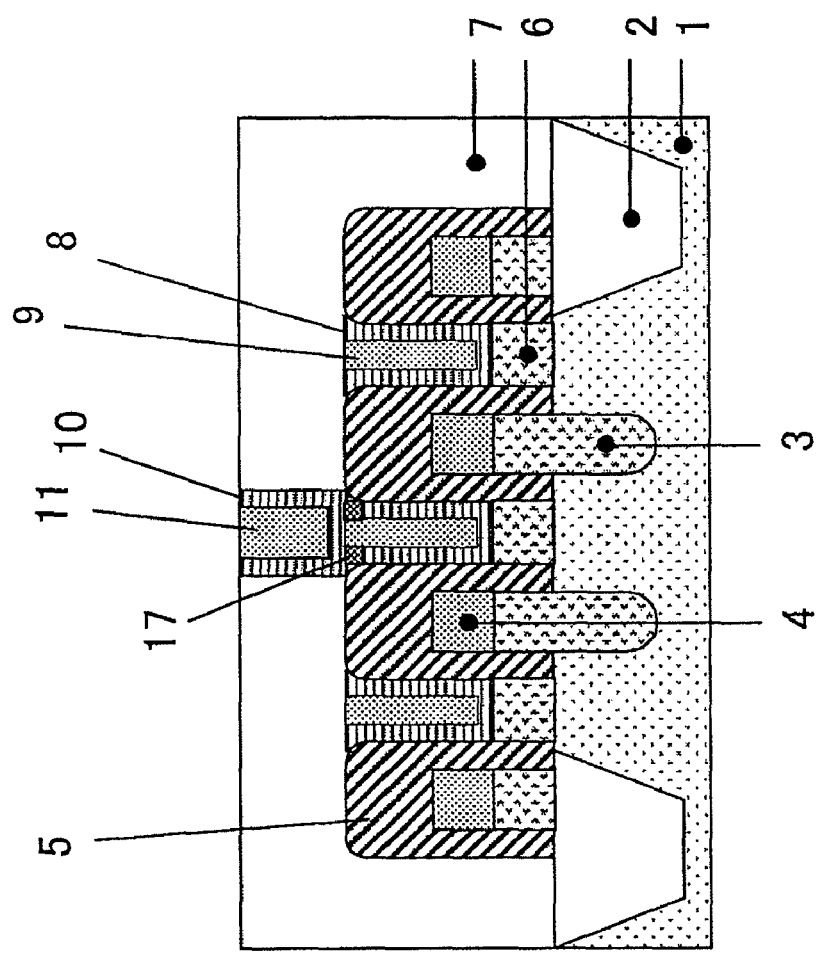
FIG. 9 is a cross-sectional view used to explain a step following the step of forming a structure illustrated in FIG. 8.
Figure 10:
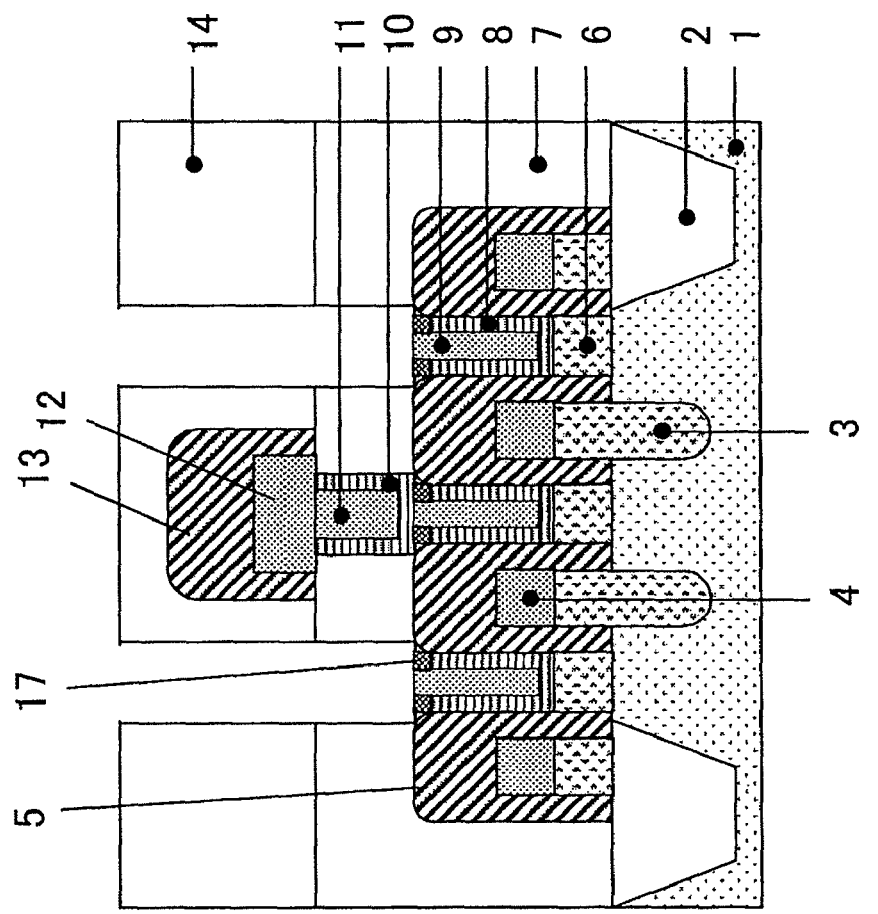
FIG. 10 is a cross-sectional view used to explain another step in the process of forming the memory cell of the DRAM in the related art.
Figure 11:
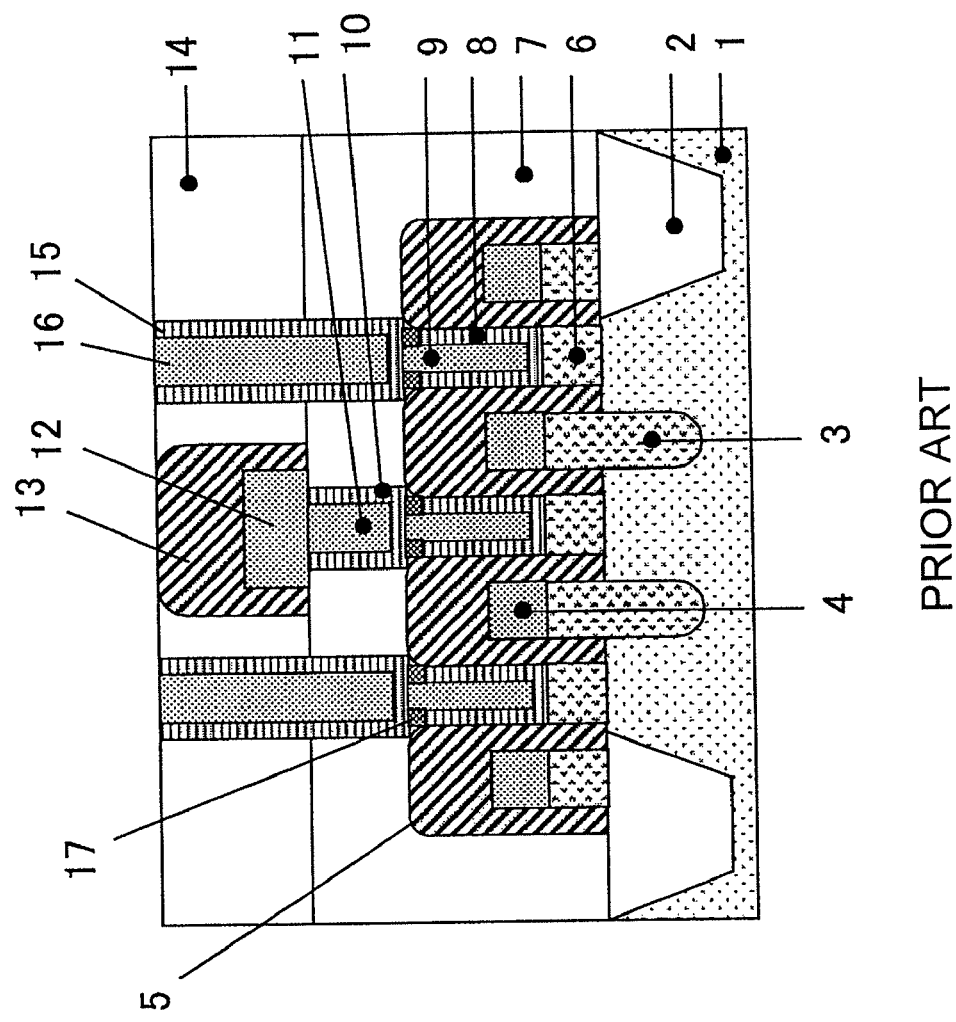
FIG. 11 is a cross-sectional view used to explain a step following the step of forming a structure illustrated in FIG. 10.

Next, as illustrated in FIG. 6, the altered layer 17 is selectively dry-etched and removed by a metal dry etcher using an etching gas containing chlorine, boron trichloride and argon. Dry etching conditions can be set to, for example, a pressure of 10 mTorr (1.33 Pa), a source power of 800 W, a bias power of 100 W, an etching gas ($Cl_2$/$BCl_3$/Ar) flow rate of 80/80/80 sccm (standard $cm^3$/min).

Next, a titanium nitride film 15 is formed inside this hole, and then a tungsten film 16 is formed so as to fill this hole. Subsequently, as illustrated in FIG. 7, CMP is performed to remove portions of the titanium nitride film and tungsten film outside the hole, thereby forming the capacitance contact plug (titanium nitride barrier film 15 and tungsten bulk part 16). This capacitance contact plug is connected through a metal pad or the like to a storage capacitor lower electrode to be formed later.

As has been described heretofore, in the present exemplary embodiment, the altered layer arising in the upper end of the barrier film of the plug is etched away at the time of forming the hole reaching the lower-side plug by dry etching. After that, an upper-side plug for connection to the lower-side plug is formed inside this hole. Consequently, it is possible to prevent a conduction failure and a resistance increase in a connecting part between the lower-side plug and the upper-side plug and achieve satisfactory interconnection.

The formation of an altered layer is remarkable in cases where a titanium-containing barrier film, such as a titanium nitride film, is used as the barrier film of the lower-side plug, and dry etching using an etching gas containing a fluorine atom-containing component is performed as etching at the time of forming the hole reaching the lower-side plug. As the fluorine atom-containing component, it is possible to use a regular etching gas component used for oxide film etching. Examples of the etching gas component include $CF_4$, $CHF_3$ and $C_4F_8$. In this case, the altered layer contains titanium (Ti) originating from the barrier film and fluorine (F) originating from the etching gas component.

In the case of such an altered layer containing Ti and F as described above, it is possible to selectively etch the altered layer with respect to the bulk part (for example, tungsten bulk part) of a lower-side plug by dry etching using an etching gas containing at least one of chlorine, boron trichloride and hydrogen chloride. This etching gas may, as necessary, contain an inert gas, such as argon, nitrogen or helium.

Dry etching processing can be performed in one of the following three ways. The first way is a method in which an insulating film dry etcher is used to create an upper-side hole, and then a metal dry etcher separate from the insulating film dry etcher is used to remove an altered layer. The second way is a method in which a dry etcher equipped with an insulating film etching chamber and a metal etching chamber is used to create an upper-side hole inside the insulating film etching chamber, and then remove an altered layer inside the metal etching chamber. The third way is a method in which a dry etcher configured by connecting an insulating film dry etching gas line and a metal dry etching gas line to the same etching chamber is used to create an upper-side hole inside this etching chamber, and then remove an altered layer.

In general, the hole is created in a forward tapered shape (a shape in which the inner diameter of the hole decreases toward the bottom thereof). Accordingly, if the upper portion of a lower-side plug (for example, a titanium nitride barrier film and a tungsten bulk part) is dug under the condition of nonselective etching at the time of removing the altered layer, the upper end of the lower-side plug becomes smaller. That is, the area of contact between the lower-side plug and the upper-side plug reduces, thus causing a resistance increase in the connecting part. In contrast, it is possible to prevent an increase in connection resistance due to a reduction in the contact area by selectively dry-etching and removing the altered layer along with the barrier film with respect to the bulk part. Not only that, as illustrated in FIGS. 3 and 6, there is formed a shape in which the upper end of the barrier film is recessed with respect to the upper end of the bulk part in the upper end of the lower-side plug (cell contact plug), and therefore, the bulk part becomes protruded. Thus, it is possible to make the area of contact with the upper-side plug all the more larger due to the formation of side surfaces of this protruding part.

The above-described exemplary embodiments are not limited to the connection of plugs to each other in a DRAM memory cell, but are applicable to a step of connecting plugs to each other also in a process of manufacturing other structures, such as a multilayer interconnect structure.

It is apparent that the present invention is not limited to the above embodiments, but may be modified and changed without departing from the scope and spirit of the invention.

What is claimed is:

1. A semiconductor device manufacturing method comprising:
    forming a first interlayer insulating film over a semiconductor substrate;
    forming a first hole in the first interlayer insulating film;
    forming a barrier film inside the first hole;
    filling a conductive material in the first hole to form a first plug;
    forming a second interlayer insulating film over the first interlayer insulating film;
    forming a second hole reaching the first plug in the second interlayer insulating film by using a first etching gas;
    selectively etching an upper end of the barrier film inside the second hole by using a second etching gas that is different from the first etching gas; and
    forming a second plug for connection to the first plug inside the second hole.

2. A semiconductor device manufacturing method comprising:
    forming a first interlayer insulating film over a semiconductor substrate;
    forming a first hole in the first interlayer insulating film;
    forming a barrier film containing titanium inside the first hole;
    filling a conductive material in the first hole to form a first plug;
    forming a second interlayer insulating film over the first interlayer insulating film;
    performing dry etching using a first etching gas containing a fluorine atom-containing component to form a second hole reaching the first plug in the second interlayer insulating film;
    selectively etching using a second etching gas that is different from the first etching gas to remove an altered layer formed as the result of an upper end of the barrier film being transformed inside the second hole; and
    forming a second plug for connection to the first plug inside the second hole.

3. The semiconductor device manufacturing method according to claim 1, wherein the selective etching is performed so that the upper end of the barrier film is recessed with respect to the upper end of the conductive material.

4. The semiconductor device manufacturing method according to claim 2, wherein the selective etching is performed so that the upper end of the barrier film is recessed with respect to the upper end of the conductive material.

5. The semiconductor device manufacturing method according to claim 1, wherein the selective etching is dry etching using the second etching gas containing at least one of chlorine, boron trichloride and hydrogen chloride.

6. The semiconductor device manufacturing method according to claim 2, wherein the selective etching is dry etching using the second etching gas containing at least one of chlorine, boron trichloride and hydrogen chloride.

7. The semiconductor device manufacturing method according to claim 1, wherein the barrier film is a titanium nitride film.

8. The semiconductor device manufacturing method according to claim 2, wherein the barrier film is a titanium nitride film.

9. The semiconductor device manufacturing method according to claim 1, wherein the conductive material is a metal.

10. The semiconductor device manufacturing method according to claim 2, wherein the conductive material is a metal.

11. The semiconductor device manufacturing method according to claim 1, wherein the conductive material is tungsten.

12. The semiconductor device manufacturing method according to claim 2, wherein the conductive material is tungsten.

* * * * *